US010468490B2

(12) United States Patent
Huang et al.

(10) Patent No.: US 10,468,490 B2
(45) Date of Patent: Nov. 5, 2019

(54) TRANSISTOR DEVICE AND SEMICONDUCTOR LAYOUT STRUCTURE

(71) Applicant: NANYA TECHNOLOGY CORPORATION, New Taipei (TW)

(72) Inventors: Jei-Cheng Huang, New Taipei (TW); Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/808,395

(22) Filed: Nov. 9, 2017

(65) Prior Publication Data

US 2019/0140096 A1 May 9, 2019

(51) Int. Cl.
H01L 29/423 (2006.01)
H01L 29/78 (2006.01)
H01L 27/02 (2006.01)

(52) U.S. Cl.
CPC ...... H01L 29/4238 (2013.01); H01L 27/0207 (2013.01); H01L 29/78 (2013.01)

(58) Field of Classification Search
CPC .......... H01L 29/42372–29/4238; H01L 29/78; H01L 27/0207
See application file for complete search history.

(56) References Cited

U.S. PATENT DOCUMENTS

| 8,716,768 | B2 | 5/2014 | Lyu et al. | |
|---|---|---|---|---|
| 2013/0037888 | A1* | 2/2013 | Han | H01L 21/823456 257/396 |
| 2013/0043506 | A1 | 2/2013 | Tsai et al. | |
| 2013/0277719 | A1 | 10/2013 | Kao et al. | |
| 2019/0027565 | A1* | 1/2019 | Rivero | H01L 21/28114 |

FOREIGN PATENT DOCUMENTS

TW 201703157 A 1/2017

* cited by examiner

Primary Examiner — Robert G Bachner
Assistant Examiner — Molly K Reida
(74) Attorney, Agent, or Firm — Muncy, Geissler, Olds & Lowe, P.C.

(57) ABSTRACT

The present disclosure provides a transistor device and a semiconductor layout structure. The transistor device includes a substrate including at least one active region, an isolation structure surrounding the active region, a gate structure disposed over the substrate, and a source/drain region disposed at two opposite sides of the gate structure. The gate structure includes a first portion extending along a first direction and a second portion extending along a second direction perpendicular to the first direction. The first portion of the gate structure overlaps a first boundary between the active region and the isolation structure.

9 Claims, 6 Drawing Sheets

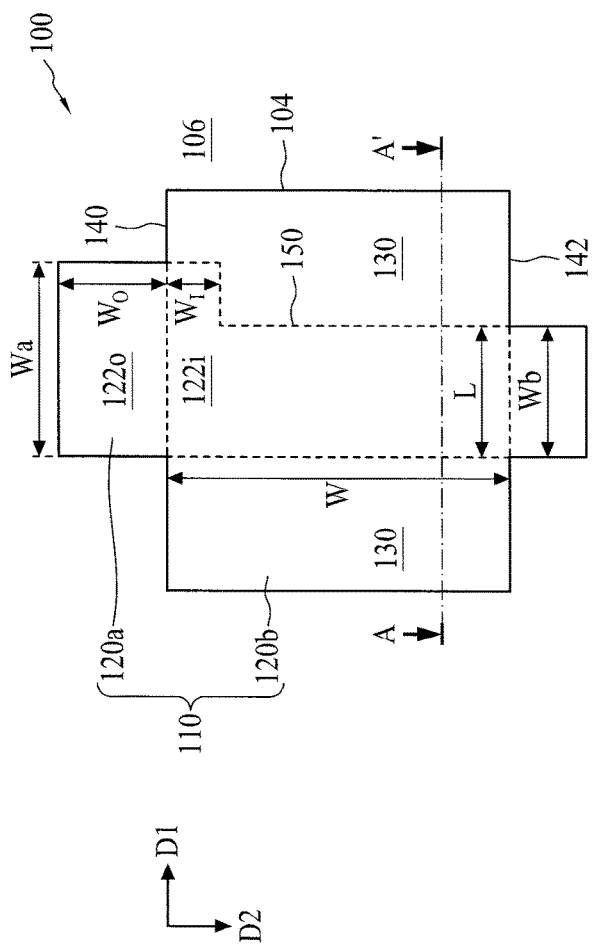
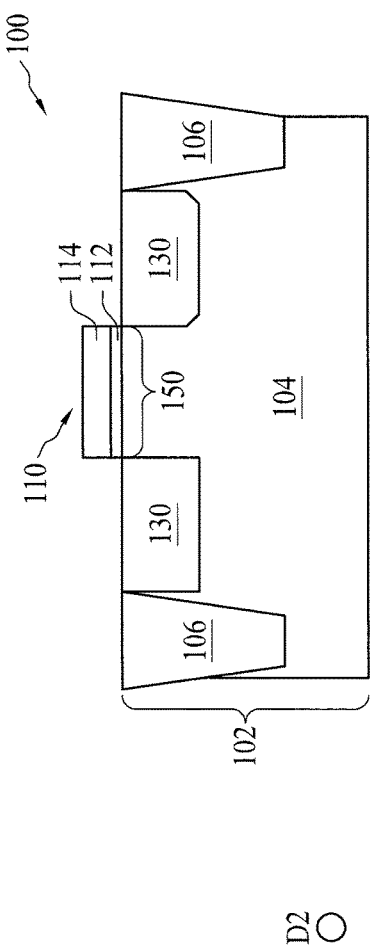
FIG. 1
FIG. 2 ial channel transistor creates increasing problems with interaction between the source/drain region and the carrier channel under the gate. For example, a boundary between an isolation structure and an active region results in a concentrated electric field. The concentrated electric field leads to leakage, which adversely affects the performance of the transistor. Therefore, there is a need to reduce leakage current and thus to improve the performance of the transistor.
TRANSISTOR DEVICE AND SEMICONDUCTOR LAYOUT STRUCTURE

TECHNICAL FIELD

The present disclosure relates to a transistor device and a semiconductor layout structure, and more particularly, to a transistor device and a semiconductor layout structure including a C-gate structure or an L-gate structure.

DISCUSSION OF THE BACKGROUND

As semiconductor fabrication technology continues to improve, sizes of electronic devices are reduced, and the size and the channel length of the conventional planar channel transistor also decrease correspondingly. Although the conventional planar channel transistor has been widely used in integrated circuit design, the ongoing reduction of the size and the channel length of the conventional planar channel transistor creates increasing problems with interaction between the source/drain region and the carrier channel under the gate. For example, a boundary between an isolation structure and an active region results in a concentrated electric field. The concentrated electric field leads to leakage, which adversely affects the performance of the transistor. Therefore, there is a need to reduce leakage current and thus to improve the performance of the transistor.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a transistor device. The transistor device includes a substrate including at least one active region, an isolation structure surrounding the active region, a gate structure disposed over the substrate, and a source/drain region disposed at two opposite sides of the gate structure. The gate structure includes a first portion extending along a first direction and a second portion extending along a second direction perpendicular to the first direction. The first portion of the gate structure overlaps a first boundary between the active region and the isolation structure.

In some embodiments, the second portion of the gate structure crosses the active region and overlaps a second boundary between the active region and the isolation structure, the second boundary extends along the first direction, and the second boundary is on an opposite side of the activation region from the first boundary.

In some embodiments, the first portion overlaps a portion of the isolation structure and a portion of the active region, and the second portion overlaps a portion of the isolation structure and a portion of the active region.

In some embodiments, the transistor device further includes a channel region under the gate structure, wherein the channel region includes an L shape. A channel length of the channel region is parallel to the first direction and a channel width of the channel region is parallel to the second direction.

In some embodiments, the gate structure further includes a third portion extending along the first direction and overlapping a second boundary between the active region and the isolation structure. The second boundary extends along the first direction and is on the opposite side of the active region compared to the first boundary.

In some embodiments, the first portion and the third portion are disposed at two opposite ends of the second portion and are physically in contact with the second portion.

In some embodiments, the first portion overlaps a portion of the isolation structure and a portion of the active region, the entire second portion overlaps the active region, and the third portion overlaps a portion of the isolation structure and a portion of the active region.

In some embodiments, the transistor device further includes a channel region under the gate structure, wherein the channel region includes a C shape. In some embodiments, a channel length of the channel region is parallel to the first direction, and a channel width of the channel region is parallel to the second direction.

Another aspect of the present disclosure provides a semiconductor layout structure. The semiconductor layout structure includes an active region surrounded by an isolation structure, at least one first gate structure disposed over the active region and the isolation structure, at least one second gate structure disposed over the active region and the isolation structure, and a plurality of source/drain regions disposed in the active region. The first gate structure includes a first portion and a third portion perpendicular to each other. The second gate structure includes a second portion parallel to the first portion and a fourth portion parallel to the third portion. The first portion of the first gate structure overlaps a first boundary between the isolation structure and the active region, and the second portion of the second gate structure overlaps a second boundary between the isolation structure and the active region. The first boundary and the second boundary are parallel to each other.

In some embodiments, the first gate structure and the second gate structure are point symmetrical with respect to a central point.

In some embodiments, the third portion of the first gate structure overlaps the second boundary, and the fourth portion of the second gate structure overlaps the first boundary.

In some embodiments, an edge of the first portion of the first gate structure is aligned with an edge of the fourth portion of the second gate structure, and an edge of the third portion of the first gate structure is aligned with an edge of the second portion of the second gate structure.

In some embodiments, the third portion of the first gate structure and the fourth portion of the second gate structure include a first distance therebetween, the first portion of the first gate structure and the fourth portion of the second gate structure include a second distance therebetween, and the third portion of the first gate structure and the second portion of the second gate structure include a third distance therebetween. In some embodiments, the first distance is greater than the second distance, and the first distance is greater than the third distance. In some embodiments, the second distance is equal to the third distance.

In some embodiments, the first portion of the first gate structure and the second portion of the second gate structure include a first width, and the third portion of the first gate structure and the fourth portion of the second gate structure include a second width. In some embodiments, the first width is greater than the second width.

In some embodiments, the first width is greater than the second distance, and the first width is greater than the third distance. In some embodiments, the second distance is greater than the second width, and the third distance are greater than the second width.

In some embodiments, the first gate structure further includes a fifth portion overlapping the second boundary, and the second gate structure further includes a sixth portion overlapping the first boundary.

In some embodiments, the first gate structure and the second gate structure are line symmetrical with respect to a central line.

In some embodiments, an edge of the first portion of the first gate structure is aligned with an edge of the sixth portion of the second gate structure, and an edge of the fifth portion of the first gate structure is aligned with an edge of the second portion of the second gate structure.

In some embodiments, the third portion of the first gate structure and the fourth portion of the second gate structure include a first distance therebetween, the first portion of the first gate structure and the sixth portion of the second gate structure include a second distance therebetween, and the fifth portion of the first gate structure and the second portion of the second gate structure include a third distance therebetween. In some embodiments, the first distance is greater than the second distance, and the first distance is greater than the third distance. In some embodiments, the second distance is equal to the third distance.

In some embodiments, the first portion and the fifth portion of the first gate structure and the second portion and the sixth portion of the second gate structure include a first width, and the third portion of the first gate structure and the fourth portion of the second gate structure include a second width. In some embodiments, the first width is greater than the second width.

In the present disclosure, a transistor device including a C-gate structure or an L-gate structure is provided. Consequently, the concentrated electric field is deflected, and thus leakage current is reduced. The transistor device including the C-gate structure provides a leakage current lower than the transistor device including the L-gate structure, while the transistor device including the L-gate structure provides a driving current greater than the transistor device including the C-gate structure. Thus, the transistor device including the C-gate structure or the L-gate structure can be fabricated depending on different product requirements. Further, the semiconductor layout structure is provided. The semiconductor layout structure includes two L-gate structures that are point symmetrical or two C-gate structures that are line symmetrical. Consequently, a total area occupied by the semiconductor layout structure can be easily reduced by layout optimization to achieve device shrinkage.

In contrast, with a comparative transistor device or semiconductor layout structure including a straight gate structure, the device suffers greater leakage current and thus has inferior performance. Further, with a comparative transistor device or semiconductor layout structure including an H-gate structure, the H-gate structure is not applicable to the full chip because the H-gate structure occupies much more area, and the area penalty is increased and thus such design results in lower device density.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

FIG. 1 is a schematic drawing illustrating a transistor device in accordance with some embodiments of the present disclosure.

FIG. 2 is a cross-sectional view of the transistor device taken along a line A-A' of FIG. 1.

DETAILED DESCRIPTION

Figure 3:
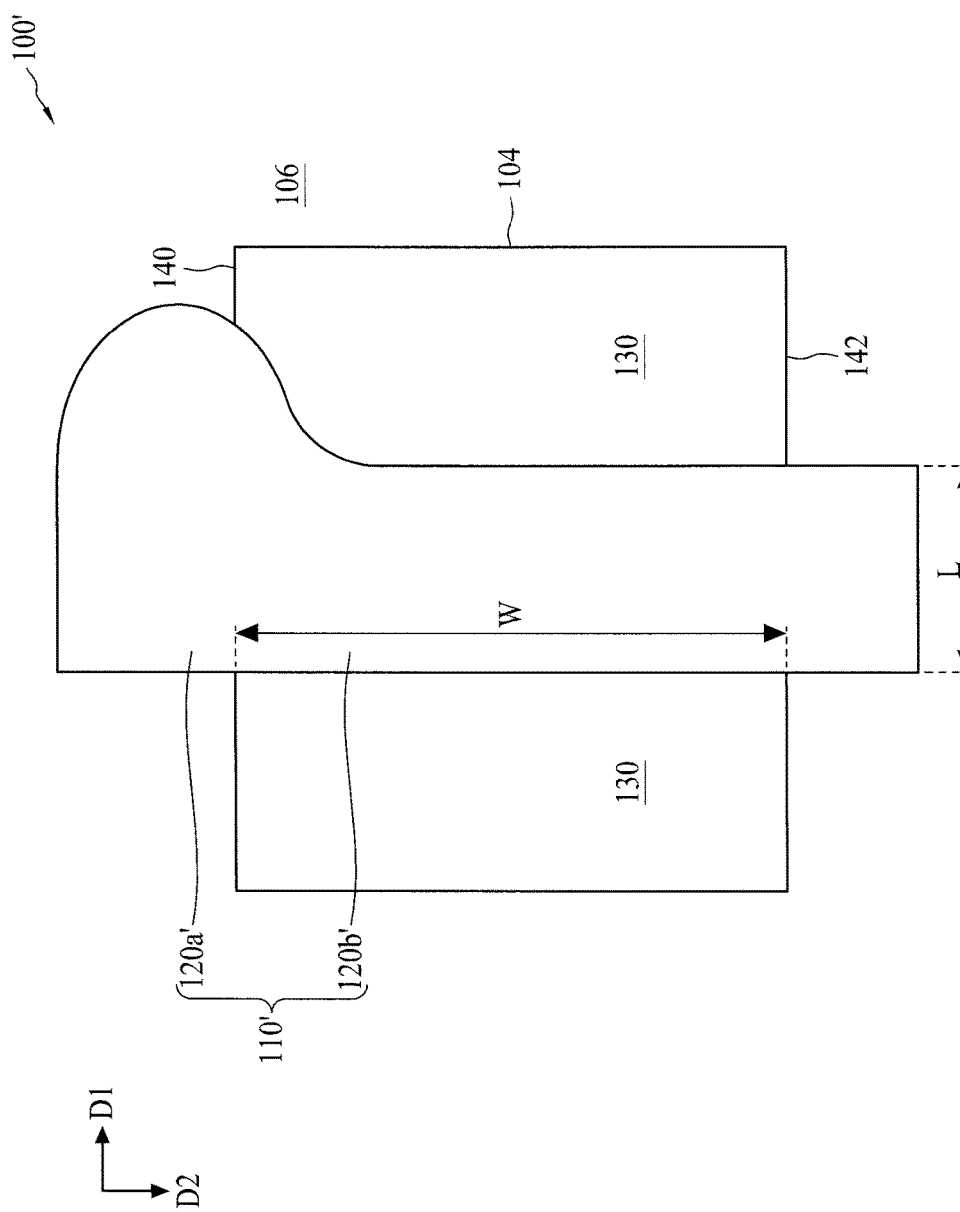
FIG. 3 is a schematic drawing illustrating a transistor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

As used herein, the term "n-type doping/doped" is to represent adding electron increasing dopants/impurities including, for example but not limited to, V or VI group atoms into a material matrix in order to manipulate the carrier numbers. As used herein, the term "p-type doping/doped" is to represent adding hole increasing dopants/impurities including, for example but not limited to, II or III group atoms into a material matrix in order to manipulate the carrier numbers.

FIG. 1 is a schematic drawing illustrating a transistor device in accordance with some embodiments of the present disclosure and FIG. 2 is a cross-sectional view of the transistor device taken along a line A-A' of FIG. 1. In some embodiments, a transistor device 100 is provided. The transistor device 100 includes a substrate 102 (shown in FIG. 2). The substrate 102 may include silicon (Si), silicon germanium (SiGe), gallium arsenide (GaAs), or other suitable semiconductor material. A well region (not shown) may be formed in the substrate 102. The well region may be neutral, or an n-type or p-type doped region, depending on the conductivity type of the transistor device 100. An isolation structure 106 such as a shallow trench isolation (hereinafter abbreviated as STI) structure is formed in the substrate 102 for defining at least an active region 104.

In some embodiments, the isolation structure 106 can be formed by the following steps. A pad oxide layer (not shown) is formed over the substrate 102. Next, a pad nitride layer (not shown) is formed. The pad oxide layer reduces stress on the substrate 102 from the pad nitride layer. Next, a patterned photoresist layer (not shown) defining a location of the isolation structure 106 is formed on the pad nitride layer. A portion of the pad nitride layer, a portion of the pad oxide layer and a portion of the substrate 102 exposed through the patterned photoresist layer are then removed, and a shallow trench (not shown) is formed in the substrate 102. After removal of the patterned photoresist layer, sidewalls and a bottom of the shallow trench are lined by an oxide liner (not shown) and the shallow trench is filled with an insulating material such as oxide. For example, a high density plasma chemical vapor deposition oxide (HDP oxide) can be used to fill the shallow trench, but the disclosure is not limited thereto. Subsequently, a planarization process is performed to remove superfluous oxide with the pad nitride layer serving as a stop layer. Next, the well region can be formed in the substrate 102 and the pad nitride layer and the pad oxide layer can subsequently be removed. Consequently, the transistor device 100 includes the isolation structure 106 surrounding the active region 104 as shown in FIG. 1.

Referring to FIGS. 1 and 2, a gate structure 110 is next disposed over the substrate 102. The gate structure 110 can be formed by the following steps. For example, a gate dielectric layer 112 is formed over the substrate 102 and a gate conductive layer 114 is formed on the gate dielectric layer 112, but the disclosure is not limited thereto. In some embodiments, the gate dielectric layer 112 can include dielectric material having high dielectric constant (high-k). For example, the gate dielectric layer 112 can include silicon oxide (SiO), silicon nitride (SiN), silicon oxynitride (SiON), metal oxide such as hafnium oxide (HfO), or other suitable material chosen for compatibility, but the disclosure is not limited thereto. The gate conductive layer 114 can include polysilicon or other suitable material such as metal materials with proper work function. Next, the gate conductive layer 114 and the gate dielectric layer 112 are patterned to form the gate structure 110 including an L shape in some embodiments, as shown in FIG. 1. Thereafter, lightly-doped drains (LDDs) (not shown) are formed in the substrate 102 and a spacer (not shown) is formed over sidewalls of the gate structure 110. Next, a source/drain region 130 is formed in the substrate 102 at two opposite sides of the gate structure 110. The source/drain region 130 includes an n-type or a p-type doped region, depending on the conductivity type of the transistor device 100.

Referring back to FIG. 1, the gate structure 110 includes a first portion 120a extending along a first direction D1 and a second portion 120b extending along a second direction D2. As shown in FIG. 1, the first direction D1 is perpendicular to the second direction D2. In other words, the first portion 120a is perpendicular to the second portion 120b. More importantly, the first portion 120a of the gate structure 110 overlaps a first boundary 140 between the active region 104 and the isolation structure 106. Further, the first portion 120a overlaps a portion of the isolation structure 106 and a portion of the active region 104, as shown in FIG. 1. Accordingly, the first portion 120a includes an inner part 122i and an outer part 122o. The inner part 122i includes a width $W_I$ and the outer part 122o includes a width $W_O$. It should be noted that a ratio of the width $W_O$ of the outer part 122o to the width $W_I$ of the inner part 122i can be between about 0.75 and about 1.5, but the disclosure is not limited thereto. In some embodiments of the present disclosure, the second portion 120b of the gate structure 110 crosses the active region 104 and overlaps a second boundary 142 between the active region 104 and the isolation structure 106. As shown in FIG. 1, the first boundary 140 and the second boundary 142 both extend along the first direction D1 and are disposed on opposite sides of the active region. Further, the second portion 120b of the gate structure 110 also overlaps a portion of the isolation structure 106 and a portion of the active region 104. The first portion 120a includes a first width Wa, the second portion 120b includes a second width Wb, and the first width Wa is greater than the second width Wb. In some embodiments, a ratio of the first width Wa to the second width Wb can be greater than 1.6, but the disclosure is not limited thereto.

Still referring to FIG. 1, the transistor device 100 includes a channel region 150 under the gate structure 110. It should be noted that the inner part 122i of the first portion 120a, which is over the active region 104, and a part of the second portion 120b, which is also over the active region 104 define the channel region 150. More importantly, the channel region 150 defined by the inner part 122i and the part of the second portion 120b includes an L shape, as indicated by the dashed line shown in FIG. 1. Further, a channel length L of the channel region 150 is parallel to the first direction D1, and a channel width W of the channel region 150 is parallel to the second direction D2.

FIG. 3 is a schematic drawing illustrating a transistor device 100' in accordance with some embodiments of the present disclosure. It should be noted that same elements in FIGS. 1 to 3 are designated by the same numeral and can be formed by same processes. Therefore, only differences are detailed. In some embodiments, the first portion of the gate structure, which includes the first width Wa greater than the second width Wb of the second portion, can be formed by manual optical proximity correction (OPC). For example, a pattern feature including a width the same as the second width Wb of the second portion 120b' can be generated, and the OPC is performed to enlarge a portion of the pattern feature where the first portion 120a' is to be formed, and thus an L-shaped pattern feature can be obtained. Consequently, the L-shaped pattern feature can be transferred to the gate conductive layer 114 and the gate dielectric layer 112 and thus an L-shaped gate structure 110' is obtained, as shown in FIG. 3.

In the transistor device 100 provided by the present disclosure, the concentrated electric field is deflected from the second portion 120b of the gate structure 110 by the inner part 122i of the first portion 120a. That is, the concentrated electric field is deflected from the main channel region 150 formed by the second portion 120b of the gate structure 110. Accordingly, leakage current is reduced, and thus performance of the transistor device 100 is improved.

Figure 4:
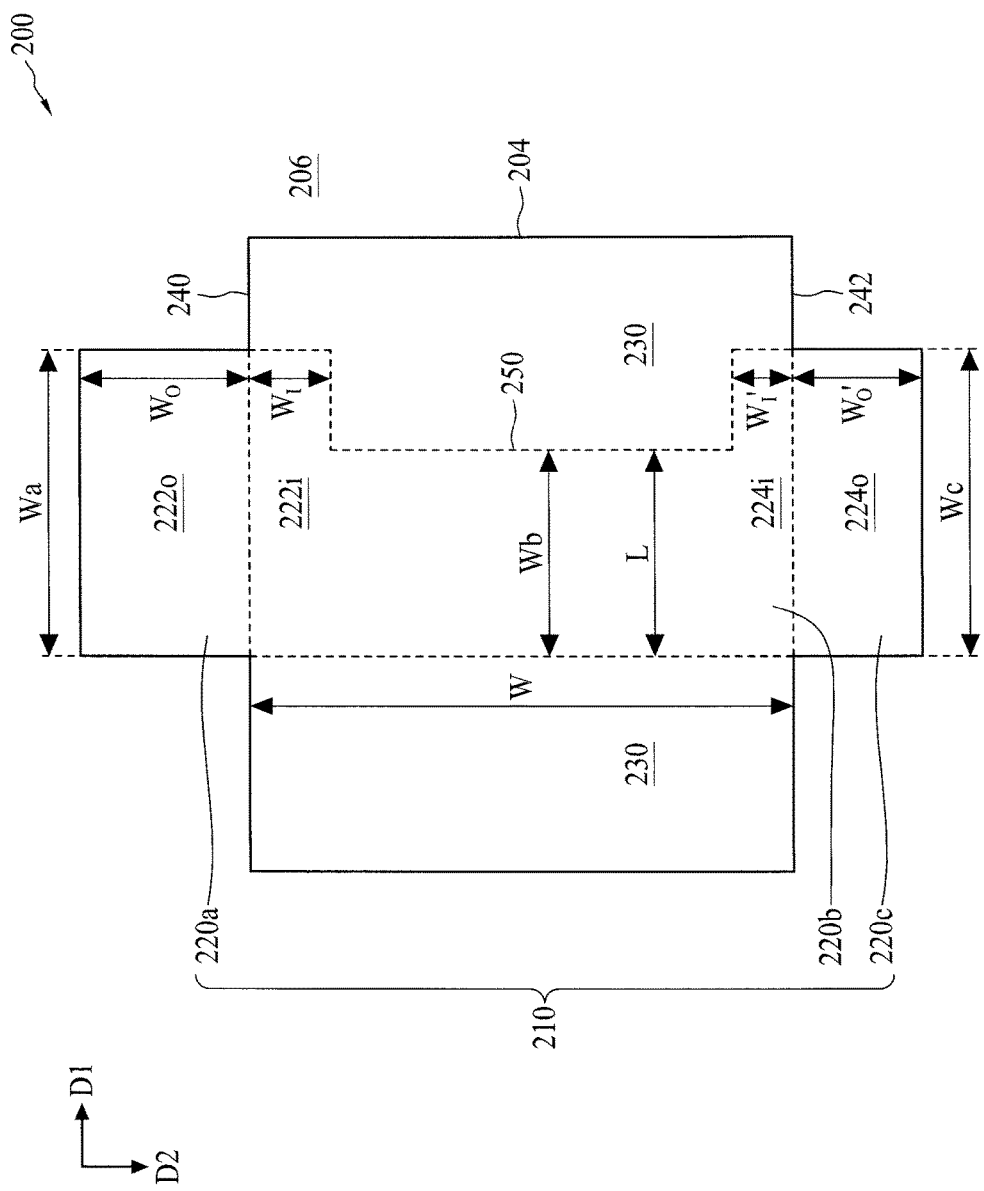
FIG. 4 is a schematic drawing illustrating a transistor device in accordance with some embodiments of the present disclosure.

FIG. 4 is a schematic drawing illustrating a transistor device in accordance with some embodiments of the present disclosure. It should be understood that similar features in FIGS. 1 and 4 can include similar materials and be formed by similar processes, and thus such details are omitted in the interest of brevity. In some embodiments, a transistor device 200 is provided. The transistor device 200 includes a substrate (as shown in FIG. 2), and a well region (not shown) may be formed in the substrate. The well region may be neutral, or an n-type or p-type doped region, depending on the conductivity type of the transistor device 200. An isolation structure 206 such as an STI structure is formed in the substrate for defining and surrounding at least one active region 204.

Referring to FIG. 4, a gate structure 210 is disposed over the substrate 102. As mentioned above, the gate structure 210 includes a gate conductive layer and a gate dielectric layer disposed between the gate conductive layer and the substrate. In some embodiments, the gate conductive layer and the gate dielectric layer are formed over the substrate and patterned to form the gate structure 210 including a C shape, as shown in FIG. 4. Additionally, LDDs (not shown) are disposed in the substrate and a spacer (not shown) is disposed over sidewalls of the gate structure 210. Next, a source/drain region 230 is formed in the substrate at two opposite sides of the gate structure 210. The source/drain region 230 includes an n-type or a p-type doped region, depending on the conductivity type of the transistor device 200.

Referring to FIG. 4, the gate structure 210 includes a first portion 220a extending along a first direction D1, a second portion 220b extending along a second direction D2, and a third portion 220c extending along the first direction D1. As shown in FIG. 1, the first direction D1 is perpendicular to the second direction D2. The first portion 220a and the third portion 220c are disposed at two opposite ends of the second portion 220b and physically in contact with the second portion 220b. In other words, the second portion 220b is disposed between the first portion 220a and the third portion 220c, and the second portion 220b connects the first portion 220a to the third portion 220c. More importantly, the first portion 220a of the gate structure 210 overlaps a first boundary 240 between the active region 204 and the isolation structure 206 and the third portion 220c of the gate structure 210 overlaps a second boundary 242 between the active region 204 and the isolation structure 206. As shown in FIG. 4, the first boundary 240 and the second boundary 242 both extend along the first direction D1, and are disposed on opposite sides of the active region 204. Further, the first portion 220a overlaps a portion of the isolation structure 206 and a portion of the active region 204, and the third portion 220c also overlaps a portion of the isolation structure 206 and a portion of the active region 204, as shown in FIG. 4. Accordingly, the first portion 220a includes an inner part 222i and an outer part 222o, and the third portion 220c includes an inner part 224i and an outer part 224o. The inner part 222i of the first portion 220a includes a width $W_I$ and the outer part 222o of the first portion 220a includes a width $W_O$. It should be noted that a ratio of the width $W_O$ of the outer part 222o to the width $W_I$ of the inner part 222i can be between about 0.75 and about 1.5, but the disclosure is not limited thereto. The inner part 224i of the third portion 220c includes a width $W_{I'}$ and the outer part 224o of the third portion 220c includes a width $W_{O'}$. It should be noted that a ratio of the width $W_{O'}$ of the outer part 224o to the width $W_{I'}$ of the inner part 224i can be between about 0.75 and about 1.5, but the disclosure is not limited thereto. Additionally, the width $W_{I'}$ of the inter part 224i of the third portion 220c can be identical to or different from the width $W_I$ of the inner part 222i of the first portion 220a, and the width $W_{O'}$ of the outer part 224o of the third portion 220c can be identical to or different from the width $W_O$ of the outer part 222o of the first portion 220a. The entire second portion 220b of the gate structure 210 overlaps the active region 204 in accordance with the embodiments. Further, the first portion 220a of the gate structure 210 includes a first width Wa, the second portion 220b of the gate structure 210 includes a second width Wb, and the third portion 220c of the gate structure 210 includes a third width Wc. The first width Wa of the first portion 220a and the third width Wc of the third portion 220c are greater than the second width Wb. In some embodiments, a ratio of the first width Wa to the second width Wb can be greater than 1.6, and a ratio of the third width Wc to the second width Wb can be greater than 1.6, but the disclosure is not limited thereto. Additionally, the first width Wa of the first portion 220a can be identical to or different from the third width Wc of the third portion 220c.

Still referring to FIG. 4, the transistor device 200 includes a channel region 250 under the gate structure 210. It should be noted that the inner part 222i of the first portion 220a, the inner part 224i of the third portion 220c, and the entire second portion 220b, all of which are above the active region 204, define the channel region 250. More importantly, the channel region 250 defined by the inner parts 222i and 224i and the entire second portion 220b includes a C shape, as indicated by a dashed line shown in FIG. 4. Further, a channel length L of the channel region 250 is parallel to the first direction D1, and a channel width W of the channel region 250 is parallel to the second direction D2.

Figure 5:
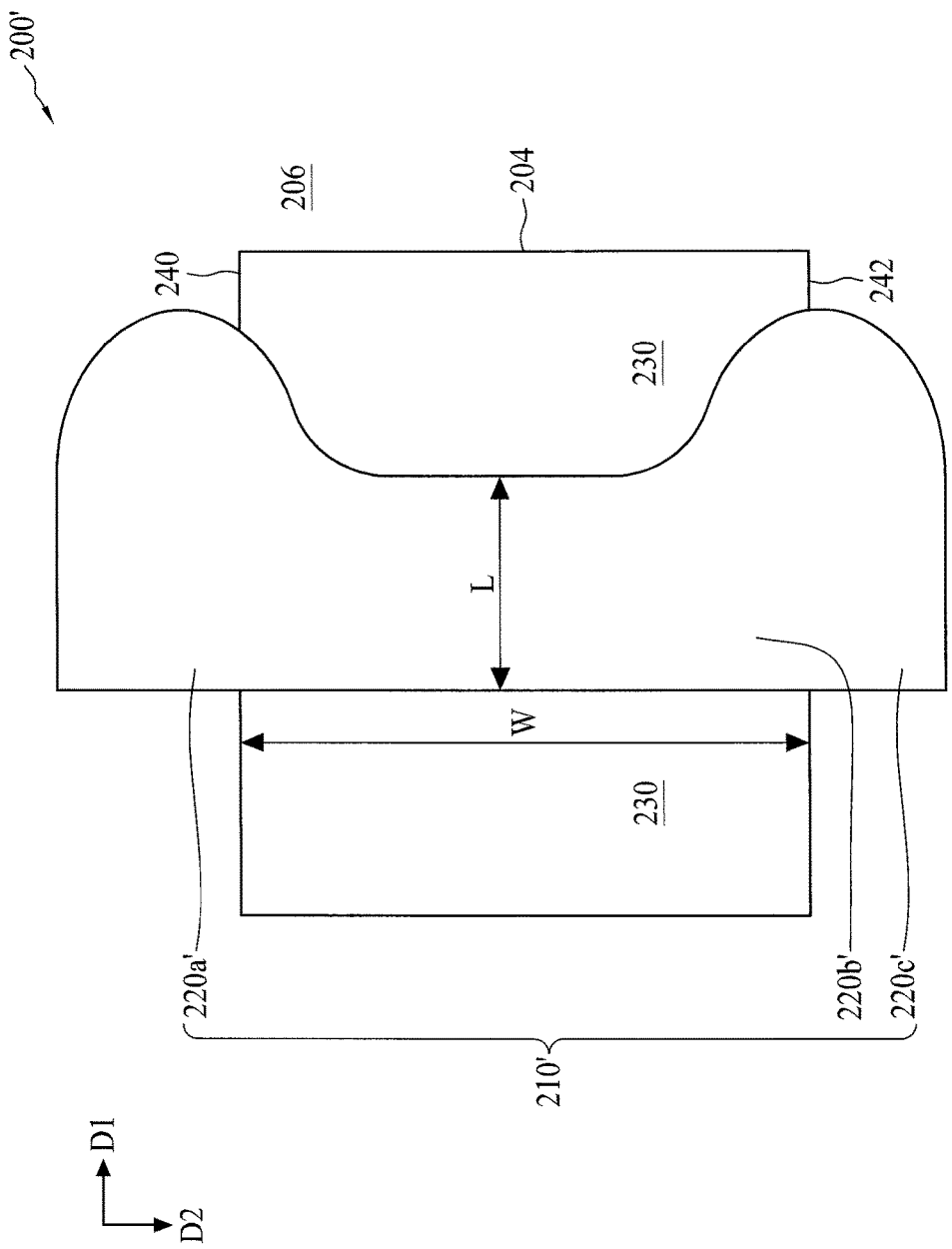
FIG. 5 is a schematic drawing illustrating a transistor device in accordance with some embodiments of the present disclosure.

FIG. 5 is a schematic drawing illustrating a transistor device 200' in accordance with some embodiments of the present disclosure. It should be noted that same elements in FIGS. 4 and 5 are designated by the same numerals and can be formed by same processes. Therefore, only differences are detailed. In some embodiments, the first portion and the third portion of the gate structure, include, respectively, the first width Wa and the third width Wc, each of which is greater than the second width Wb of the second portion. In addition, in some embodiments, the first portion and the third portion of the gate structure can be formed by manual OPC. For example, a pattern feature including a width equal to the second width Wb of the second portion 220b can be generated, and the OPC can be performed to enlarge two end portions of the pattern feature where the first portion and the third portion are to be formed, and thus obtaining a C-shaped pattern feature. Consequently, the C-shaped pattern can be transferred to the gate conductive layer and the gate dielectric layer, and thus a C-shaped gate structure 210' is obtained, as shown in FIG. 5.

In the transistor device 200 provided by the present disclosure, the concentrated electric field is deflected from the second portion 220b of the gate structure 210 by the inner part 222i of the first portion 220a and the inner part 224i of the third portion 220c. That is, the concentrated electric field is deflected from the main channel region 250 formed by the second portion 220b of the gate structure 210. Accordingly, leakage current is further reduced, and thus performance of the transistor device 200 is improved.

The transistor device 200 including the C-gate structure 210, provides a leakage current lower than that provided by the transistor device 100 including the L-gate structure 110. On the other hand, the transistor device 100 including the L-gate structure 110 provides a diving current greater than that provided by the transistor device 200 including the C-gate structure 210. Accordingly, the transistor device 200 and the transistor device 100 can be fabricated depending on product requirements.

Figure 6:
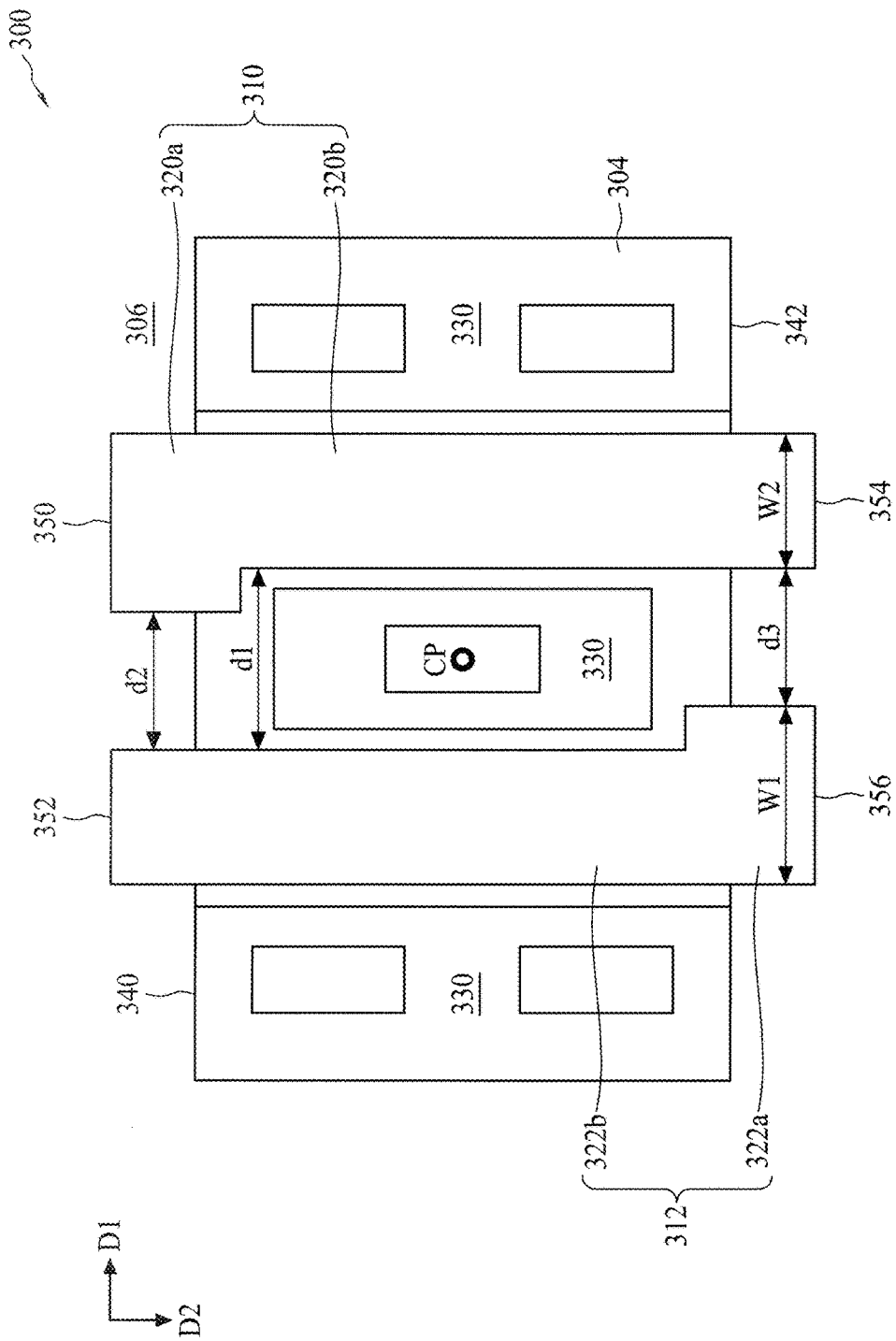
FIG. 6 is a schematic drawing illustrating a semiconductor layout structure in accordance with some embodiments of the present disclosure.

FIG. 6 is a schematic drawing illustrating a semiconductor layout structure 300 in accordance with some embodiments of the present disclosure. In some embodiments of the present disclosure, the semiconductor layout structure 300 includes an active region 304 surrounded by an isolation structure 306. The active region 304, as mentioned above, can be an n-type or a p-type doped region, depending on the conductivity type of the semiconductor layout structure 300. The semiconductor layout structure 300 includes at least one first gate structure 310 disposed over the active region 304 and the isolation structure 306, at least one second gate structure 312 disposed over the active region 304 and the isolation structure 306, and a plurality of source/drain regions 330 disposed in the active region 304. As mentioned above, the source/drain regions 330 can be n-type or p-type doped region, depending on the conductivity type of the semiconductor layout structure 300. The first gate structure 310 includes a first portion 320a extending along a first direction D1 and a third portion 320b extending along a second direction D2. The first direction D1 is perpendicular to the second direction D2. In other words, the first portion 320a of the first gate structure 310 and the third portion 320b of the first gate structure 310 are perpendicular to each other. The second gate structure 312 includes a second portion 322a parallel to the first portion 320a and a fourth portion 322b parallel to the third portion 320b.

In detail, the first portion 320a of the first gate structure 310 overlaps a first boundary 340 between the isolation structure 306 and the active region 304, and the second portion 322a of the second gate structure 312 overlaps a second boundary 342 between the isolation structure 304 and the active region 304. As shown in FIG. 6, the first boundary 340 and the second boundary 342 are parallel to each other. Further, the third portion 320b of the first gate structure 310 crosses the active region 304 and overlaps the second boundary 342, while the fourth portion 322b of the second gate structure 312 crosses the active region 304 and overlaps the first boundary 340. In some embodiments of the present disclosure, an edge 350 of the first portion 320a of the first gate structure 310 is aligned with an edge 352 of the fourth portion 322b of the second gate structure 312 along the first direction D1, and an edge 354 of the third portion 320b of the first gate structure 310 is aligned with an edge 356 of the second portion 322a of the second gate structure 312 along the first direction D1.

Still referring to FIG. 6, the third portion 320b of the first gate structure 310 and the fourth portion 322b of the second gate structure 312 include a first distance d1 therebetween, the first portion 320a of the first gate structure 310 and the fourth portion 322b of the second gate structure 312 include a second distance d2 therebetween, and the third portion 320b of the first gate structure 310 and the second portion 322a of the second gate structure 312 include a third distance d3 therebetween. The first distance d1 is greater than the second distance d2, and the first distance d1 is greater than the third distance d3. In some embodiments, the second distance d2 is equal to the third distance d3. Further, the first portion 320a of the first gate structure 310 and the second portion 322a of the second gate structure 312 include a first width W1, and the third portion 320b of the first gate structure 310 and the fourth portion 322b of the second gate structure 312 include a second width W2. The first width W1 is greater than the second width W2. Accordingly, both of the first gate structure 310 and the second gate structure 312 are L-gate structures, and the first gate structure 310 and the second gate structure 312 of the semiconductor layout structure are point symmetrical with respect to a central point CP. Additionally, in some embodiments, the first width W1 is greater than the second distance d2 and the first width W1 is greater than the third distance d3. In some embodiments, the second distance d2 and the third distance d3 are greater than the second width W2, but the disclosure is not limited thereto.

According to the semiconductor layout structure 300, each of the first gate structure 310 and the second gate structure 312 forms a transistor device with the source/drain regions 330 disposed at its two sides. Thus, at least two transistor devices including the L-gate structures are obtained. Accordingly, the transistor devices include the advantages of lower leakage currents as mentioned above. Further, since the first gate structure 310 and the second gate structure 312 are point symmetric, distance between the two gate structures 310 and 312 can be reduced as long as the second distance d2 and the third distance d3 do not violate design rules. Therefore, a total area occupied by the semiconductor layout structure 300 can be easily reduced by layout optimization to achieve device shrinkage.

Figure 7:
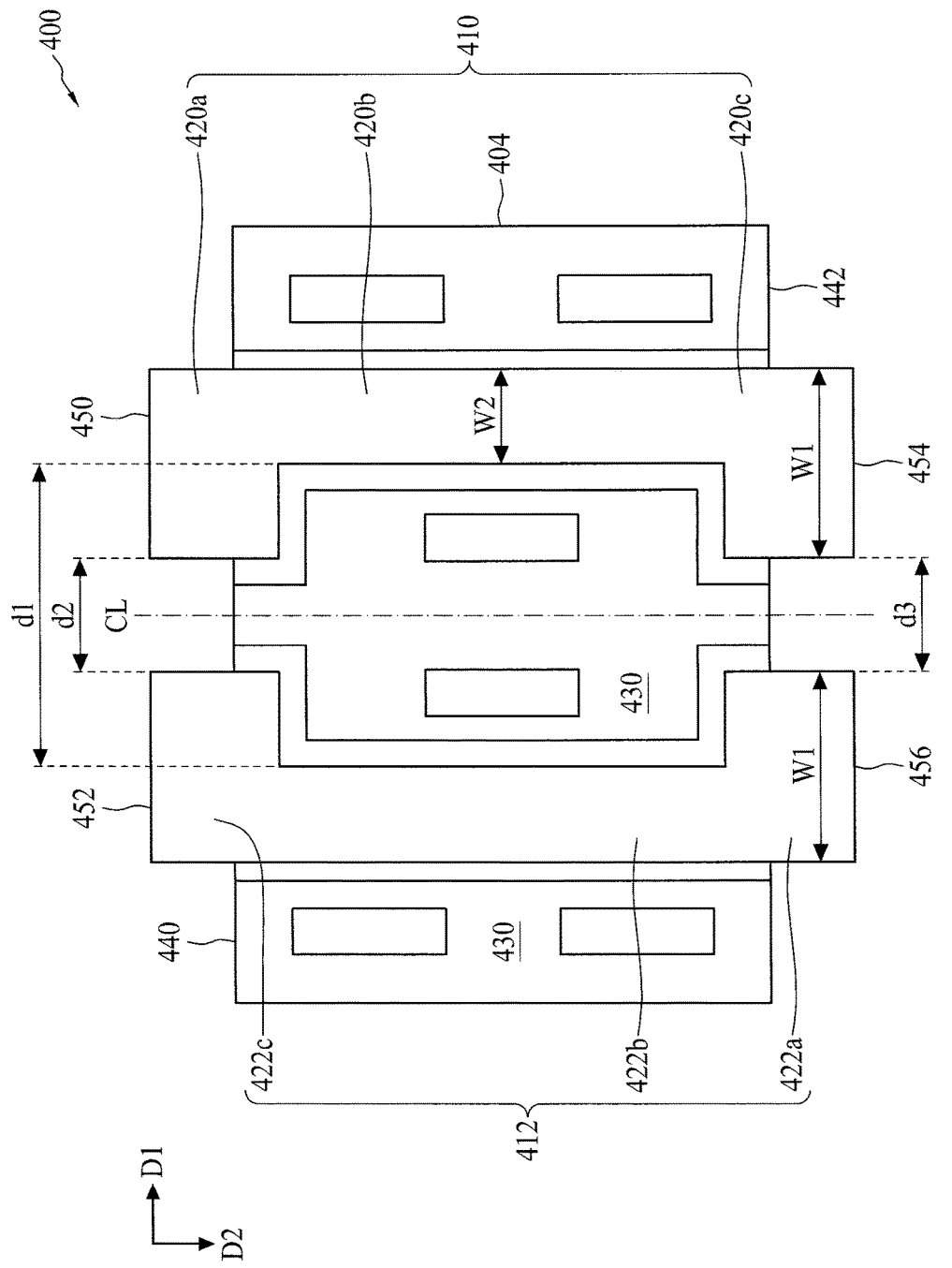
FIG. 7 is a schematic drawing illustrating a semiconductor layout structure in accordance with some embodiments of the present disclosure.

FIG. 7 is a schematic drawing illustrating a semiconductor layout structure 400 in accordance with some embodiments of the present disclosure. In some embodiments of the present disclosure, the semiconductor layout structure 400 includes an active region 404 surrounded by an isolation structure 406. The active region 404, as mentioned above, can be an n-type or a p-typed doped region, depending on the conductivity type of the semiconductor layout structure 400. The semiconductor layout structure 400 includes at least one first gate structure 410 disposed over the active region 404 and the isolation structure 406, at least one second gate structure 412 disposed over the active region 404 and the isolation structure 406, and a plurality of source/drain regions 430 disposed in the active region 404. As mentioned above, the source/drain regions 430 can be n-type or p-type doped region, depending on the conductivity type of the semiconductor layout structure 400. The first gate structure 410 includes a first portion 420a extending along a first direction D1, a third portion 420b extending along a second direction D2, and a fifth portion 420c extending along the first direction D1. The first direction D1 is perpendicular to the second direction D2. In other words, the first portion 420a and the fifth portion 420c are perpendicular to the third portion 420b. Further, the first portion 420a and the fifth portion 420c are disposed at two opposite ends of the third portion 420b, and the first portion 420a and the fifth portion 420c are both physically in contact with the third portion 420b. In other words, the third portion 420b is disposed between the first portion 420a and the fifth portion 420c, and the third portion 420b connects to both the first portion 420a and the fifth portion 420c. The second gate structure 412 includes a second portion 422a parallel to the fifth portion 420c, a fourth portion 422b parallel to the third portion 420b, and a sixth portion 422c parallel to the first portion 420a. Further, the second portion 422a and the sixth portion 422c are disposed at two opposite ends of the fourth portion 422b, and the second portion 422a and the sixth portion 422c are both physically in contact with the fourth portion 422b. In other words, the fourth portion 422b is disposed between the second portion 422a and the sixth portion 422c, and the fourth portion 422b connects to both the second portion 422a and the sixth portion 422c.

In detail, the first portion 420a of the first gate structure 410 and the sixth portion 422c of the second gate structure 412 overlap a first boundary 440 between the isolation structure 406 and the active region 404. The fifth portion 420c of the first gate structure 410 and the second portion 422a of the second gate structure 412 overlap a second boundary 442 between the isolation structure 404 and the active region 404. As shown in FIG. 7, the first boundary 440 and the second boundary 442 are parallel to each other. Further, both of the third portion 420b of the first gate structure 410 and the fourth portion 422b cross the active region 4041 in addition, both the entire third portion 420b of the first gate structure 410 and the entire fourth portion 422b of the second gate structure 412 overlap the active region 404. In some embodiments of the present disclosure, an edge 450 of the first portion 420a of the first gate structure 410 is aligned with an edge 452 of the sixth portion 422c of the second gate structure 412 along the first direction D1. In addition, an edge 454 of the fifth portion 420c of the first gate structure 410 is aligned with an edge 456 of the second portion 422a of the second gate structure 412 along the first direction D1.

Still referring to FIG. 7, the third portion 420b of the first gate structure 410 and the fourth portion 422b of the second gate structure 412 include a first distance d1 therebetween, the first portion 420a of the first gate structure 410 and the sixth portion 422c of the second gate structure 412 include a second distance d2 therebetween, and the fifth portion 420c of the first gate structure 410 and the second portion 422a of the second gate structure 412 include a third distance d3 therebetween. The first distance d1 is greater than the second distance d2, and the first distance d1 is greater the third distance d3. In some embodiments, the second distance d2 is equal to the third distance d3. The first portion 420a and the fifth portion 420c of the first gate structure 410 both include a first width W1, and the second portion 422a and the sixth portion 422c of the second gate structure 412 also include a first width W1. The third portion 420b of the first gate structure 410 and the fourth portion 422b of the second gate structure 412 include a second width W2. The first width W1 is greater than the second width W2. Accordingly, both the first gate structure 410 and the second gate structure 412 are C-gate structures, and the first gate structure 410 and the second gate structure 412 of the semiconductor layout structure are line symmetrical with respect to a central line CL. Additionally, in some embodiments, the first width W1 is greater than the second distance d2, and the first width W1 is greater than the third distance d3. In some embodiments, the second distance d2 is greater than the second width W2, and the third distance d3 is greater than the second width W2, but the disclosure is not limited thereto.

According to the semiconductor layout structure 400, each of the first gate structure 410 and the second gate structure 412 forms a transistor device with the source/drain regions 430 disposed at its two sides. Thus, at least two transistor devices including the C-gate structures are obtained. Accordingly, the transistor devices provide the advantage of lower leakage currents as mentioned above. Further, since the first gate structure 410 and the second gate structure 412 are point symmetrical, distance between the two gate structures 410 and 412 can be reduced as long as the second distance d2 and the third distance d3 do not violate design rules. Therefore, a total area occupied by the semiconductor layout structure 400 can be easily reduced by layout optimization to achieve device shrinkage.

In the present disclosure, the transistor device 200 including the C-gate structure 210 and the transistor device 100 including the L-gate structure 110 are provided. Consequently, the concentrated electric field is deflected from the main channel region 150 and 250, and thus leakage current is reduced. The transistor device 200 including the C-gate structure 210 provides a leakage current lower than that provided by the transistor device 100 including the L-gate structure 110, while the transistor device 100 including the L-gate structure 110 provides a driving current greater than that provided by the transistor device 200 including the C-gate structure 210. Thus, the transistor device 200 including C-gate structure 210 or the transistor device 100 including the L-gate structure 110 can be fabricated depending on different product requirements. Further, the semiconductor layout structures 300 and 400 are provided. The semiconductor layout structure 300 includes two L-gate structures 310 and 312 that are point symmetrical, and the semiconductor layout structure 400 includes two C-gate structures 410 and 412 that are line symmetrical. Consequently, a total area occupied by the semiconductor layout structure 300 or 400 can be easily reduced by layout optimization to achieve device shrinkage.

In contrast, with a comparative transistor device or layout structure including a straight gate structure, the device suffers greater leakage current and thus has inferior performance. Further, a comparative transistor device or layout structure including an H-gate structure is not applicable to a full chip, because the H-gate structure occupies much more area, the area penalty is increased and thus suffers from lower device density.

One aspect of the present disclosure provides a transistor device. The transistor device include a substrate including at least one active region, a gate structure disposed over the substrate, and a source/drain region disposed at two opposite sides of the gate structure. The gate structure includes a first portion extending along a first direction and a second portion extending along a second direction perpendicular to the first direction. The first portion of the gate structure overlaps a first boundary between the active region and the isolation structure.

One aspect of the present disclosure provides semiconductor layout structure. The semiconductor layout structure includes an active region surrounded by an isolation structure, at least one first gate structure disposed over the active region and the isolation structure, at least one second gate structure disposed over the active region and the isolation structure, and a plurality of source/drain regions disposed in the active region. The first gate structure includes a first portion and a third portion perpendicular to each other. The second gate structure includes a second portion parallel to the first portion and a fourth portion parallel to the third portion. The first portion of the first gate structure overlaps a first boundary between the isolation structure and the active region, and the second portion of the second gate structure overlaps a second boundary between the isolation structure and the active region. The first boundary and the second boundary are parallel to each other.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor layout structure comprising:
an active region surrounded by an isolation structure;
at least one first gate structure disposed over the active region and the isolation structure, the first gate structure comprising a first portion and a third portion perpendicular to each other;
at least one second gate structure disposed over the active region and the isolation structure, the second gate structure comprising a second portion parallel to the first portion and a fourth portion parallel to the third portion; and
a plurality of source/drain regions disposed in the active region,
wherein the first portion of the first gate structure overlaps a first boundary between the isolation structure and the active region, the second portion of the second gate structure overlaps a second boundary between the isolation structure and the active region, and the first boundary and the second boundary are parallel to each other;
wherein each of the first portion of the first gate structure and the second portion of the second gate structure includes a first width in a first direction, each of the third portion of the first gate structure and the fourth portion of the second gate structure includes a second width in the first direction, and a ratio of the first width to the second width is greater than 1.6;
wherein each of the first portion of the first gate structure and the second portion of the second gate structure includes an inner part disposed over the active region and an outer part disposed over the isolation structure, the inner part includes a third width in a second direction perpendicular to the first direction and the outer part includes a fourth width in the second direction, and a ratio of the fourth width of the outer part to the third width of the inner part ranges from 0.75 to 1.5;
wherein the third portion of the first gate structure and the fourth portion of the second gate structure comprise a first distance therebetween, the first portion of the first gate structure and the fourth portion of the second gate structure comprise a second distance therebetween, the third portion of the first gate structure and the second portion of the second gate structure comprise a third distance therebetween, the first distance is greater than the second distance, the first distance is greater than the third distance, and the second distance is equal to the third distance;
wherein the first portion of the first gate structure and the second portion of the second gate structure comprise a first width, the third portion of the first gate structure and the fourth portion of the second gate structure comprise a second width, and the first width is greater than the second width; and
wherein the first width is greater than the second distance, the first width is greater than the third distance, and the second distance and the third distance are greater than the second width.

2. The semiconductor layout structure of claim 1, wherein the first gate structure and the second gate structure are point symmetrical with respect to a central point.

3. The semiconductor layout structure of claim 1, wherein the third portion of the first gate structure overlaps the second boundary, and the fourth portion of the second gate structure overlaps the first boundary.

4. The semiconductor layout structure of claim 3, wherein an edge of the first portion of the first gate structure is aligned with an edge of the fourth portion of the second gate structure, and an edge of the third portion of the first gate structure is aligned with an edge of the second portion of the second gate structure.

5. The semiconductor layout structure of claim 1, wherein the first gate structure further comprises a fifth portion overlapping the second boundary, and the second gate structure further comprises a sixth portion overlapping the first boundary.

6. The semiconductor layout structure of claim 5, wherein the first gate structure and the second gate structure are line symmetrical with respect to a central line.

7. The semiconductor layout structure of claim 5, wherein an edge of the first portion is aligned with an edge of the sixth portion, and an edge of the fifth portion is aligned with an edge of the second portion.

8. The semiconductor layout structure of claim 5, wherein the third portion of the first gate structure and the fourth portion of the second gate structure comprise a first distance therebetween, the first portion of the first gate structure and the sixth portion of the second gate structure comprise a second distance therebetween, the fifth portion of the first gate structure and the second portion of the second gate structure comprise a third distance therebetween, the first distance is greater than the second distance, the first distance is greater than the third distance, and the second distance is equal to the third distance.

9. The semiconductor layout structure of claim 5, wherein the first portion and the fifth portion of the first gate structure and the second portion and the sixth portion of the second gate structure comprise [the first width, the third portion of the first gate structure and the fourth portion of the second gate structure comprise the second width, and the first width is greater than the second width.

* * * * *